United States Patent [19]

Yamamoto

[11] 4,386,419
[45] May 31, 1983

[54] MEMORY DEVICE WITH VARIABLE LOAD

[75] Inventor: Toru Yamamoto, Tokyo, Japan

[73] Assignee: Nippon Electric Co., Ltd., Tokyo, Japan

[21] Appl. No.: 124,669

[22] Filed: Feb. 26, 1980

[30] Foreign Application Priority Data

Feb. 26, 1979 [JP] Japan .................................. 54-21687

[51] Int. Cl.³ ........................ G11C 11/40; G11C 7/00
[52] U.S. Cl. .................................... 365/203; 365/190
[58] Field of Search ............... 365/189, 190, 202, 203, 365/156, 154; 307/238

[56] References Cited

U.S. PATENT DOCUMENTS 3,949,383 4/1976 Askin et al. ......................... 365/190
3,967,252 6/1976 Donnelly ............................. 365/190
4,099,265 7/1978 Abe ..................................... 365/154

Primary Examiner—James W. Moffitt
Attorney, Agent, or Firm—Sughrue, Mion, Zinn, Macpeak and Seas

[57] ABSTRACT

A memory device operable with high speed and with low power consumption is provided. The device is provided with a plurality of memory cells, a plurality of digit lines, a plurality of variable load elements arranged between the digit lines and a predetermined potential source. The device includes control means for making the conductance of the load element larger during a transition period from a write cycle to a read cycle than it is in the write cycle and in the read cycle.

21 Claims, 11 Drawing Figures

MEMORY DEVICE WITH VARIABLE LOAD

BACKGROUND OF THE INVENTION

The present invention relates to a memory device and, more particularly, to a static memory device employing insulated gate field effect transistors (IGFET).

In the static memory device, write operation to and read operation from memory cells of the memory device are performed through a pair of digit lines provided with each unit of column, as is well known to a person skilled in the art. The pair of digit lines are connected to a constant voltage source through load elements, for example, resistors. In this type of memory device it occurs that by applying logic data, e.g. logical "0", to the digit line pair, the data is written into one memory cell coupled with the digit line pair and thereafter a stored information in another memory cell also coupled with the same digit line pair is read-out. In such a case, after the write operation and prior to the read operation, it is necessary to remove a potential level difference between the digit line pair which has resulted from the write operation. If this is not done, the worst case possibly occurs in that the level difference left in the digit lines is erroneously written into the memory cell selected to be subjected to the read operation. This leads to an instability in the memory operation. The erroneous operation is problematic particularly in the case where the read data is an inverse data, e.g. logical "1". Therefore, the read operation undertaken after the write operation must be performed after the digit line pair is balanced in potential level. Also in this case, when the digit line pair having a write level of one logical data responds to a read level of another logical data, it experiences a large level change, leading to a delay or an elongation of the access time. The problem may be solved by employing load elements having a large conductance for the digit line pair to shorten the time required for balancing the digit line pair. This approach, however, requires an enlargement of the shapes of the transistors of the flip-flop circuits and their peripheral circuits in order to increase the driving capability of the transistors. Accordingly, it is difficult to obtain a high density memory device and besides, the current flowing through the digit lines increases, so that the power consumption increases.

SUMMARY OF THE INVENTION

Accordingly, an object of this invention is to provide a memory device with an improved access time.

Another object of the invention is to provide a memory device with reduced power consumption.

A memory device according to this invention is characterized by employing a variable load means for the digit lines, whose resistance is variable in such a manner that during a transient period from the write cycle to the read cycle it is turned to a small value while in the write and read cycles it is of a high value.

The variable load means may be made of first and second IGFETs having drains commonly connected to a potential source and sources commonly connected to the digit line, wherein a fixed potential is applied to the gate of the first IGFET and a control signal is applied to the gate of the second IGFET.

According to the present invention, there is provided a memory device comprising a static memory cell array and pair of digit lines terminated by two IGFETs connected in parallel, the gate potential of the first IGFET being at a fixed voltage and the gate of the second IGFETs being controlled by a signal produced by a write command signal.

A memory device according to one embodiment of the present invention comprises a plurality of memory cells, a plurality of data lines through which logic information is transferred to and from the memory cells, a plurality of variable load means coupled between the data lines and a predetermined potential, and control means for operatively rendering conductance of the variable load means larger in a transient period from a write cycle to a read cycle than in the write cycle and in the read cycle.

According to the present invention, there is also provided a memory device comprising a plurality of address lines, a plurality of data lines, a plurality of memory cells, a plurality of variable load means arranged between the data lines and a predetermined potential, means for supplying a control signal having a first level for designating a write operation and a second level for designating a read operation, detection means for detecting a change from the first level to the second level in the control signal, and control means responsive to the detection means for operatively increasing the value of the conductance of the load means.

DESCRIPTION OF THE PREFERRED EMBODIMENT

Figure 1:
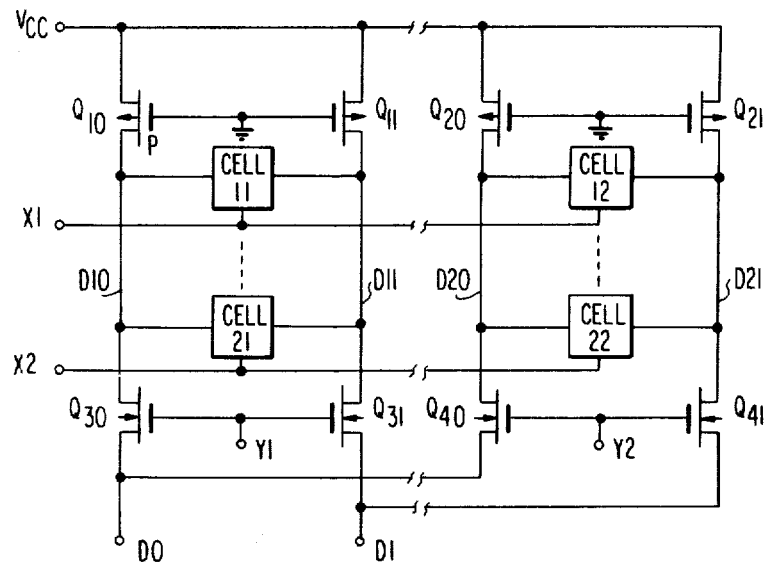
FIG. 1 is a circuit diagram of the major part of a conventional memory.

Referring to FIG. 1, there is shown an embodiment of a conventional static memory. In the following description of the invention, the IGFETs used are combination of P-channel and N-channel MISFETs which is known as a complementary FET or G-MOS structure. The prior art semiconductor memory device comprises a static memory cell array including memory cells 11, 12, 21 and 22, address signal lines $X_1$, $X_2$, $Y_1$ and $Y_2$, digit lines $D_{10}$, $D_{11}$, $D_{20}$ and $D_{21}$, and transfer gate MISFETs $Q_{30}$, $Q_{31}$, $Q_{40}$ and $Q_{41}$. The digit lines are terminated by P-channel MISFETs $Q_{10}$, $Q_{11}$, $Q_{20}$ and $Q_{21}$ as load elements with ground (GND) potential at the gates.

Figure 2:
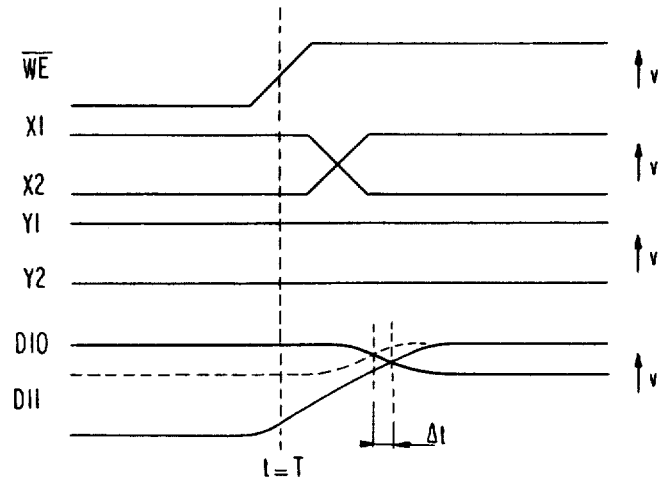
FIG. 2 is a set of timing charts for illustrating the operation of the memory device shown in FIG. 1.

When the digit lines are terminated in such a way, a relatively long time is required for the digit line to return from a write mode to a read mode. This results in a delayed access or an elongation of the access time of the memory device. The reason for this will be described below in detail with reference to FIGS. 1 and 2. It is assumed that, when the data bus line $D_0$, and the digit lines $D_{10}$ or $D_{20}$ are in a high level, the data in the memory cells have logical state "0" while, when the data bus line $D_1$, and the digit lines $D_{11}$ or $D_{21}$ are in a high level, the memory cells have logical level "1". It is further assumed that, at time point $t = T$, a write enable signal $\overline{WE}$ as an external write command is switched from a write mode ("0") to a read mode ("1"), and that, before $t = T$, "0" is written into the memory cell 11. On this assumption, the digit line $D_{11}$ is in a low level. In the case of reading out data "1" from the memory cell 21 immediately after data "0" is written into the memory cell 11 (after $t = T$), the wave form ($D_{10}$, $D_{11}$) of an output signal as indicated by a solid line is delayed by $\Delta t$ seconds from the wave form indicated by a dotted line of a signal of "0" on the digit line $D_{11}$ which is assumed to be read-out from the cell 11 because the low level of the digit line $D_{11}$ due to write "0" indicated by the solid line is far lower than that due to read "0" indicated by the dotted line. When a ready cycle follows a write cycle, the access time is longer than that when the write cycle or the read cycle follows the read cycle. This slow access substantially determines the entire access time of the memory device. In order to eliminate this defect, until the levels of the address signals are determined, the low level of the digit line before $t = T$ ($D_{11}$ indicated by the solid line in FIG. 2) must be restored to at least the low level ($D_{11}$ indicated by the dotted line in FIG. 2) at the read cycle. As a result, it is necessary to accelerate the level restoration of the digit line by increasing the physical size of the MISFETs $Q_{10}$, $Q_{11}$, $Q_{20}$ and $Q_{21}$ as load elements, thereby to decrease of their impedance. When the impedance is decreased in such a way, it becomes necessary to increase the driving ability of a data write drive circuit (not shown) coupled with the data bus lines $D_0$ and $D_1$ in accordance with the extent of the increase of the loads elements, and to decrease the impedances of MISFETs $Q_{30}$, $Q_{31}$, $Q_{40}$ and $Q_{41}$ in order to realize the write operation. In short, the increase of the size of the load FET brings about the increase of a chip area which is undesirable for an integrated circuit.

An embodiment of the memory device according to the present invention will be described in detail with reference to FIGS. 3–10.

Figure 3:
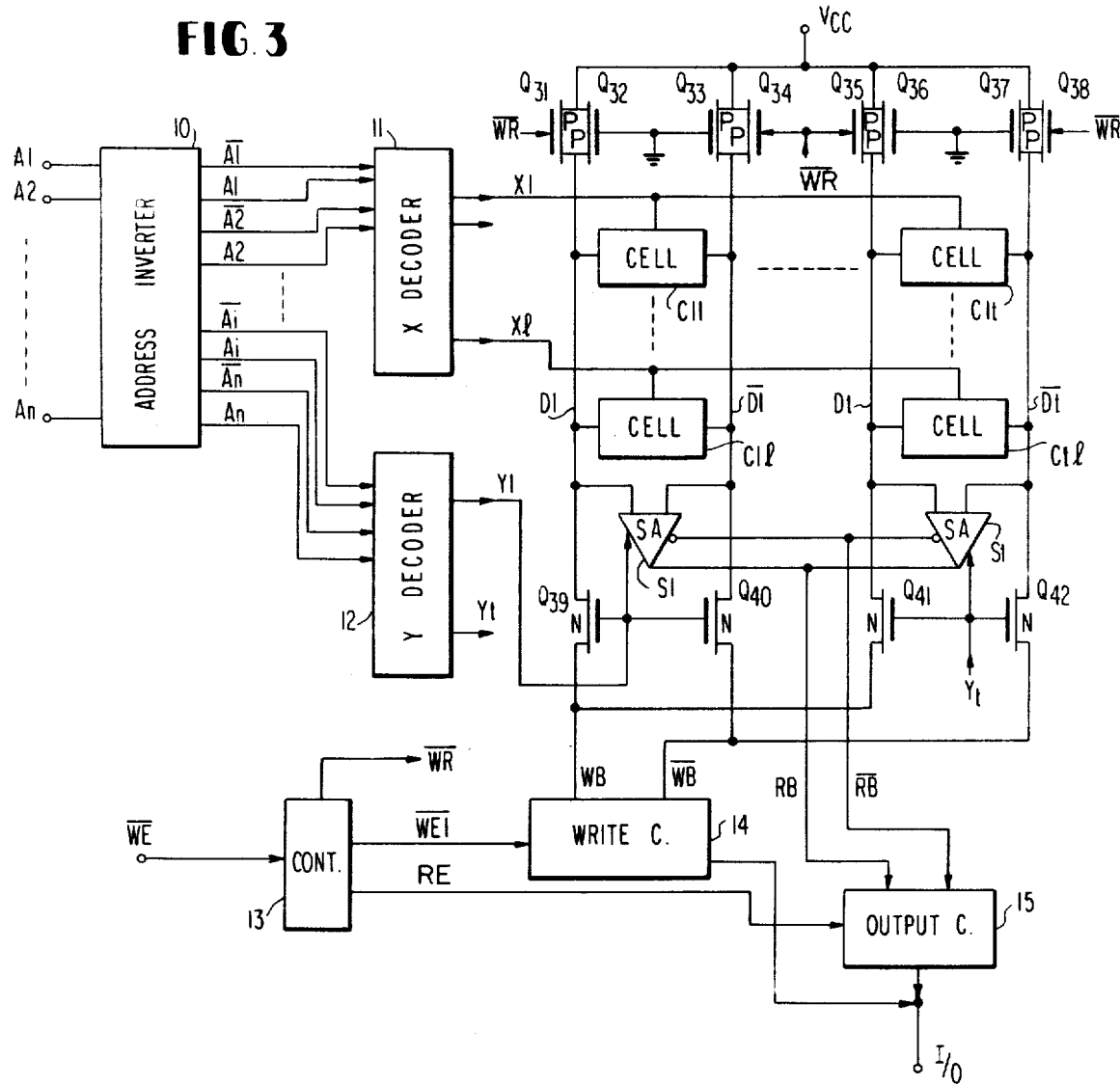
FIG. 3 is a block diagram showing one embodiment of a memory device according to the invention.

As shown in FIG. 3, an address inverter 10 receives an address input signal of n bits to produce true and complementary address signals $\overline{A1}$, $A1$, $\overline{A2}$, $A2$; ... $\overline{An}$, $An$ with respect to the address input signals. Those address signals are partially applied to an X decoder 11. The X decoder 11, for example, in the form of NOR gate arrangement, selects one of word lines $X_1-X_l$ in accordance with the applied address signals. The remaining address signals are applied to a Y address decoder 12 for selecting one of Y select lines $Y_1-Y_l$, to apply the selected one with a selected potential level. Digit lines $D_1$ and $\overline{D_1}$ are coupled with memory cells $C_{11}-C_{1l}$. The digit line $D_1$ is coupled with a power source potential $V_{cc}$, through P-channel transistors $Q_{31}$ and $Q_{32}$. Similarly, a digit line $\overline{D_1}$ is also coupled with a power source $V_{cc}$, through P-channel transistors $Q_{33}$ and $Q_{34}$. The digit lines $D_1$ and $\overline{D_1}$ are connected, respectively, to write bus lines WB and $\overline{WB}$ coupled with a write circuit 14 via N-channel transfer gate transistors $Q_{39}$ and $Q_{40}$ having the gates connected to the Y select line $Y_1$. The sense amplifier $S_1$, receiving input signals from the digit lines $D_1$ and $\overline{D_1}$, is enabled in accordance with a signal level of the Y select line $Y_1$ to amplify the input signals on the digit lines $D_1$ and $\overline{D_1}$. The amplified signal from the amplifier $S_1$ is transmitted to the read bus lines RB and $\overline{RB}$ connected to an output circuit 15. A write command signal $\overline{WE}$ is active when in low level to control the memory to effect a write operation and to effect a read operation when in high level. A control circuit 13, on receiving the write command signal $\overline{WE}$, produces a write enable signal $\overline{WE1}$ of active low potential. The write enable signal $\overline{WE1}$ is transmitted to a write circuit 14. The control circuit 13 further produces a read enable signal RE which is applied to the output circuit 15.

A read enable signal RE is an active high signal to enable the output or read circuit 15 when the signal RE is high in level. An input/output terminal I/O is, coupled with the write circuit 14 and the output circuit 15 of the read data. The transistors $Q_{32}$ and $Q_{33}$ are grounded at the gates and are always conductive. A write end signal $\overline{WR}$ is applied to the gates of the transistors $Q_{31}$ and $Q_{34}$. The write end signal $\overline{WR}$ is low in level to render the transistors $Q_{31}$ and $Q_{34}$ conductive when the operation changes from a write state to a read state. Namely, the write end signal is made low immediately after the signal $\overline{WE}$ changes from low to high.

The transistors $Q_{32}$ and $Q_{33}$, corresponding to the load elements of the conventional memory, may have smaller conductance than that of the conventional ones. With respect to the transistors $Q_{32}$ and $Q_{33}$, it is sufficient that those transistors $Q_{32}$ and $Q_{33}$ can compensate the leakage current of the digit line on the high level side under a stable or stationary condition. The transistors $Q_{31}$ and $Q_{34}$, having a higher current ability than the transistors $Q_{32}$ and $Q_{33}$, can balance the levels of the signals on the digit lines $D_1$ and $\overline{D_1}$ quickly by conducting at a transition from write operation to read operation.

Figure 4:
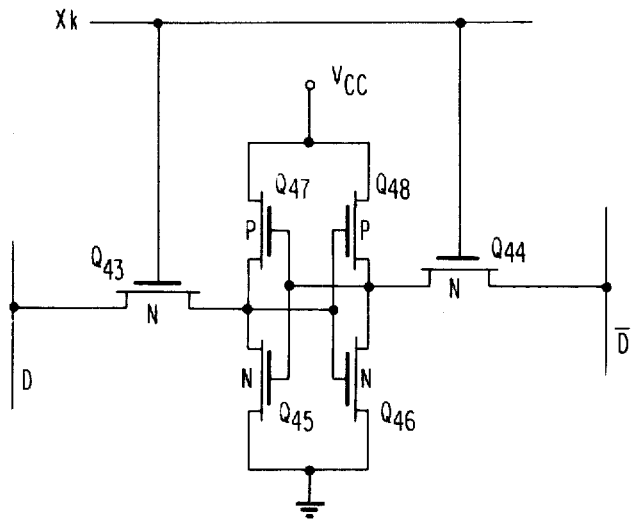
FIG. 4 is a circuit diagram of a memory cell used in the memory device shown in FIG. 3.

A structure of a memory cell to be used in the memory device of FIG. 3 is shown in FIG. 4. As shown, the memory cell is of the C-MOS type. An inverter having a P-channel transistor $Q_{47}$ and an N-channel transistor $Q_{45}$ and another inverter having a P-channel transistor $Q_{48}$ and an N-channel transistor $Q_{46}$ are cross-connected at their inputs and outputs as shown. The N-channel transfer gate transistors $Q_{43}$ and $Q_{44}$, having their gates connected to a word line $X_k$, are arranged between the drains of the transistors $Q_{45}$ and $Q_{46}$ and the digit line D and $\overline{D}$.

Figure 5:
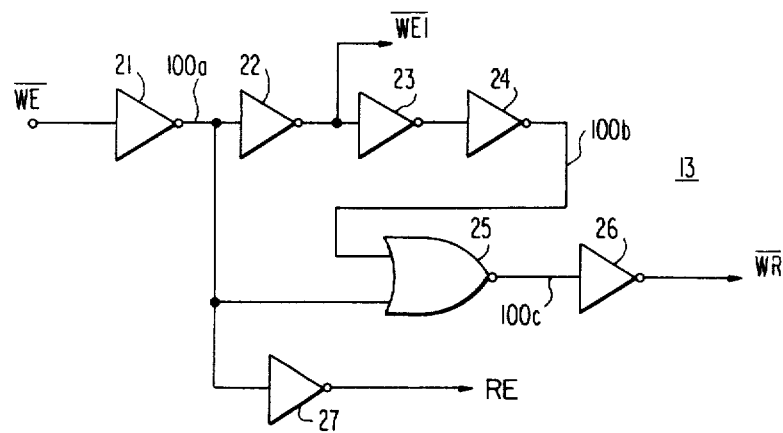
FIG. 5 is a block diagram of the control circuit shown in FIG. 3.

The control circuit 13 of FIG. 3 will be described by referring to FIG. 5. The write command signal $\overline{WE}$ is applied to a series circuit having inverters 21–24. An inverter 22 at the second stage produces a write enable signal $\overline{WE1}$. An output 100$a$ from the inverter 21 is applied to one input of a NOR gate 25 and is also applied to an inverter 27, to derive a read enable signal RE from the inverter 27. An output signal 100$b$ from the inverter 24 is applied to the other input of the NOR gate. An output signal 100$c$ from the NOR gate 25 is applied as the write end signal $\overline{WR}$ to the gates of the transistors $Q_{31}$, $Q_{34}$, $Q_{35}$ and $Q_{38}$, through an inverter 26.

Figure 9:
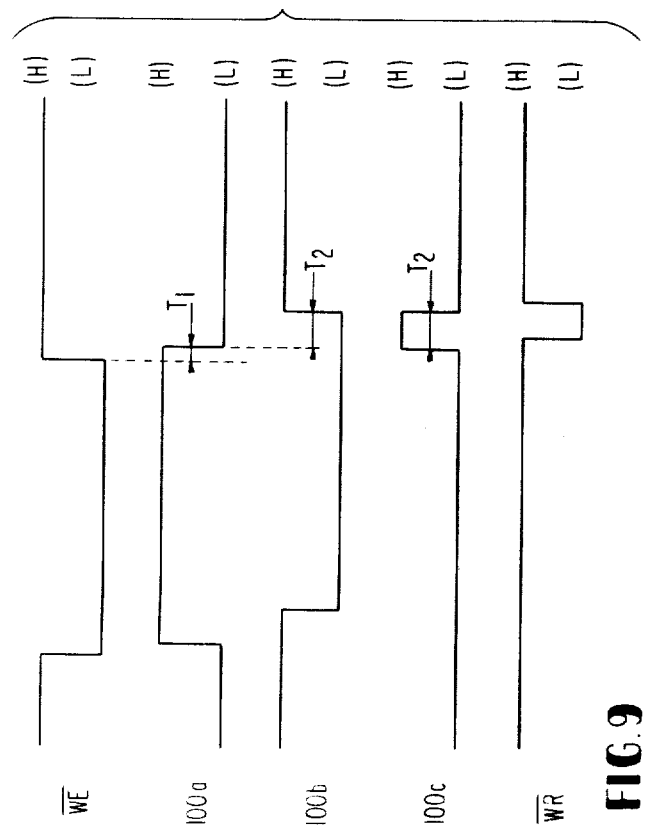
FIG. 9 is a set of wave forms useful in explaining the operation of the control circuit.

The operation of the control circuit 13 will be described by referring to FIG. 9. When the write command signal $\overline{WE}$ changes from low level to high level to command a read operation following a write operation, the output signal 100$a$ from the inverter 21 changes from high level to low level after a delay time of $T_1$ in the inverter 21. After the sum $T_2$ of the delays $T_2$ in the inverters 22-24, the output signal from the inverter 24 changes from low level to high level. During the period of time $T_2$ that the outputs 100a and 100b are both in low level, an output signal 100c from the NOR gate 25 is in high level. The output signal 100c is then inverted by the inverter 26 to serve as the write end signal $\overline{WR}$ having a low level period $T_2$. The active period of the signal $\overline{WR}$ corresponds to the sum of the delays of the inverters 22-24 and is approximately equal to 15-30 nano seconds. In this way, the write end signal $\overline{WR}$ is produced immediately after the write operation ends. In the present invention, the period $T_2$ is preferably selected to substantially equal to a time constant of the resistances of the transistors $Q_{31}$, $Q_{34}$, $Q_{35}$ and $Q_{38}$ and the capacitances of the digit lines $D_1$, $\overline{D_1}$; . . . ; $D_t$ and $\overline{D_t}$. In the above circuit, the inverters 21-27 and the NOR gate 25 may be constructed by C-MOS structure.

Figure 6:
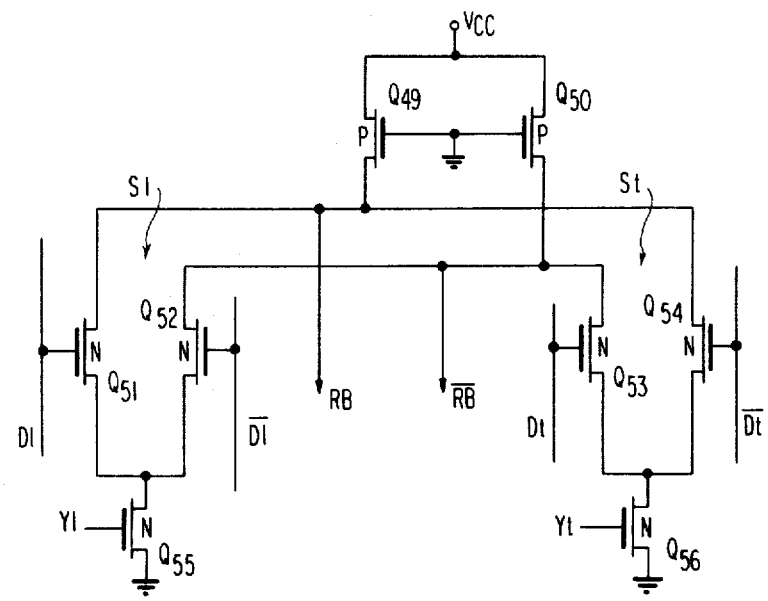
FIG. 6 is a circuit diagram of the sense circuit of the memory device shown in FIG. 3.

FIG. 6 shows a circuit structure of each sense circuit $S_1$-$S_t$. Each sense circuit is comprised of a differential amplifier. As shown, P-channel load transistors $Q_{49}$ and $Q_{50}$ are common to the differential input transistors $Q_{51}$-$Q_{54}$ in each array and read bus lines RB and $\overline{RB}$ are connected to the common connection points, respectively, as shown. The differential input transistors $Q_{51}$ and $Q_{52}$ are enabled only when the N-channel transistor $Q_{55}$ is rendered conductive in response to a high level of the Y select line $Y_1$. At this time, these transistors sense the signal levels of the digit lines $D_1$ and $\overline{D_1}$ and transmit the sensed signal levels to the read bus lines RB and $\overline{RB}$.

Figure 7:
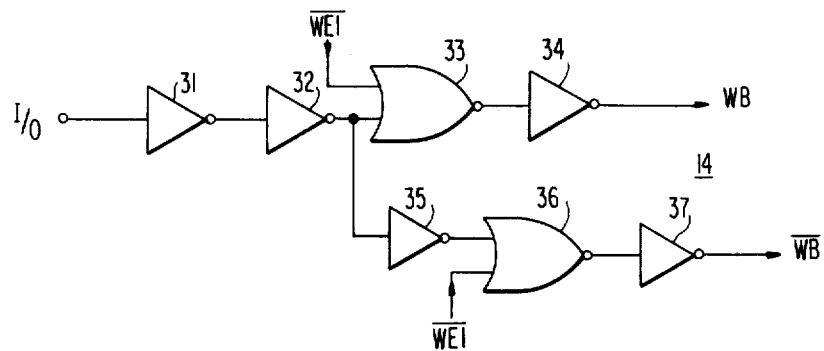
FIG. 7 is a block diagram of a write circuit of the memory device shown in FIG. 3.

FIG. 7 is a circuit structure of the write circuit 14. The write data applied to the input/output terminal I/O is amplified through inverters 31 and 32 and then are applied to a NOR gate 33 and to a NOR gate 36 via an inverter 35, each receiving the write enable signal $\overline{WE1}$. The output signal from the NOR gate 33 is amplified through an inverter 34 and is delivered as a first write data to a write bus line WB. The output signal of the inverter 32 is inverted in level by an inverter 35 and then is delivered as a second write data to a bus line $\overline{WB}$, through a NOR gate 36 receiving the write enable signal and via an inverter 37. Note here that the data at the input/output terminal I/O is effectively transferred to the write bus lines WB and $\overline{WB}$ only when the write enable signal $\overline{WE1}$ is low in level. In this way, the true and complementary write data is outputted.

Figure 8:
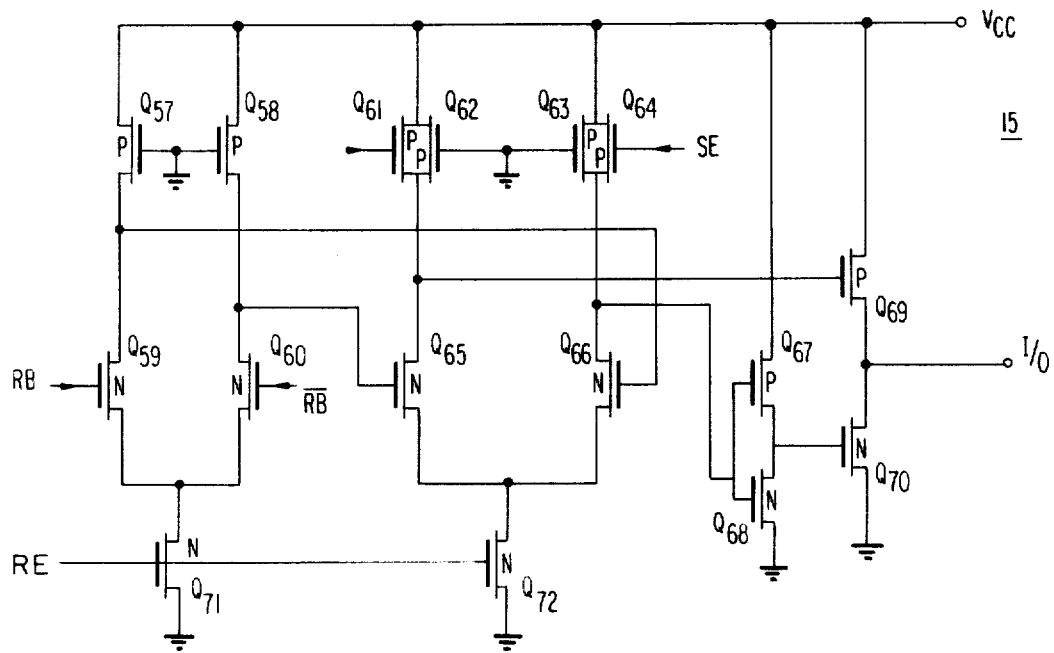
FIG. 8 is a circuit diagram of an output circuit of the memory device shown in FIG. 3.

FIG. 8 shows a circuit diagram of the output circuit 15. P-channel transistors $Q_{57}$ and $Q_{58}$, and N-channel transistors $Q_{59}$ and $Q_{60}$ having their gates connected to the read bus lines RB and $\overline{RB}$, cooperate to form a first stage amplifier when a transistor 71 is rendered conductive by a high level of the read enable signal RE. The output signal from the first stage differential amplifier in applied to a second stage differential amplifier. The second stage differential amplifier has P-channel transistors $Q_{61}$-$Q_{64}$, N-channel transistors $Q_{65}$ and $Q_{66}$ for the differential input, and an N-channel transistor $Q_{72}$. The second stage differential amplifier operates when the transistor $Q_{72}$ is rendered conductive in response to a high level of the read enable signal RE. At the same time, the transistors $Q_{61}$ and $Q_{64}$ are also rendered conductive to supply a large load current. The output signal of the second stage differential amplifier is applied to the input/output terminal I/O, through a C-MOS type push-pull output circuit composed of transistors $Q_{67}$-$Q_{70}$. The output circuit 15 operates only when the signal RE is in high level to apply read data to the input/output terminal I/O. When the signal RE is of a low level, the transistors $Q_{62}$ and $Q_{63}$ renders the transistors $Q_{69}$ and $Q_{67}$ non-conductive, respectively, and the transistors $Q_{69}$ and $Q_{70}$ are both non-conductive to separate the input/output terminal I/O from the output circuit 15.

Figure 10:
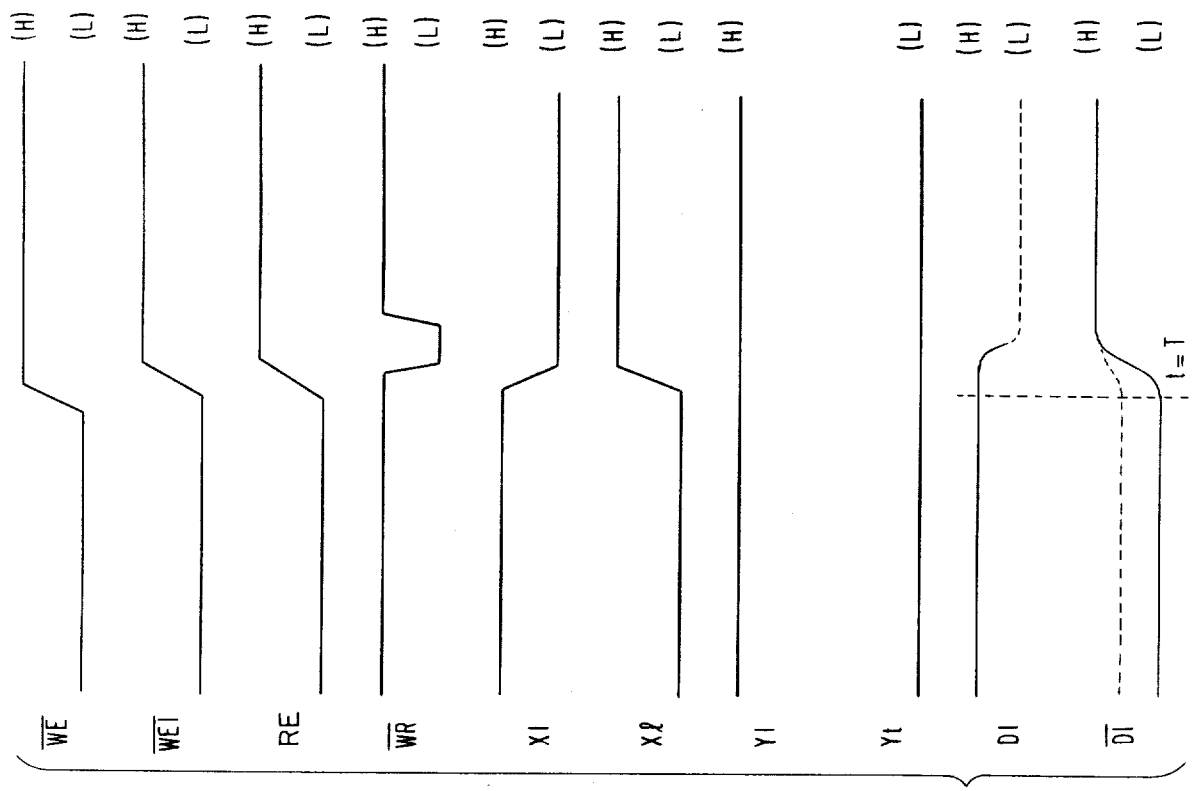
FIG. 10 is a set of wave forms illustrating the operation of the memory device shown in FIG. 3.

The operation of the memory device of this embodiment according to the invention will be described by referring to FIGS. 3 and 10. The problem of slow readout occurs where the digit line which has previously been provided with the write "0" signal, is turned to a level to read a "1" from a selected memory cell storing the "1" data. In other words, if a power voltage Vcc and the ground potential are employed as power sources, and the high level near the voltage Vcc and the low voltage near the ground potential are assumed as logic "1" and "0", respectively, the "0" level fed to the digit line by the write circuit 14 in a write operation is far lower and nearer to the ground potential than the "0" level on the digit line provided by the selected memory cell in a read operation. Thus, it may be stated that the "0" level in a write operation (write "0" level) takes a deeper low level as compared to the "0" level in a read operation (read "0" level). As a result, the longest transition period occurs where it is required to shift the level of the same digit line from the write "0" level to the read "1" level. This occurs in an operation where one logic information is written into a memory cell and then another memory cell storing the opposite logic information is read out on the same digit line. This problem will be explained in more detail with respect to the memory cells $C_{11}$ and $C_{1t}$ connected to the same digit line pair, D1 and $\overline{D1}$. The low level of the signal $\overline{WE}$ is maintained until t=T and the memory cell $C_{11}$ is selected by the high level signal on the word line X1 and the high level signal. on the Y select line Y1. Under this condition, the data "0" is written into the memory cell $C_{11}$ and at this time the digit line $D_1$ is kept in high level while the digit line $\overline{D1}$ is kept in deep low level. At an instant T, the signal $\overline{WE}$ shifts its level to a high level, so that the operation mode of the memory device shifts to a read mode. In the read mode, the word line X1 changes to a high level and the memory cell $C_{1t}$ storing the data "1" is selected for read out. At this time, immediately after the termination of the write mode, the signal $\overline{WR}$ assumes a low level to turn on the load transistors $Q_{31}$, $Q_{34}$, $Q_{35}$ and $Q_{38}$. Therefore, in the respective parallel circuits the conducting transistors $Q_{32}$, $Q_{33}$, $Q_{36}$ and $Q_{37}$ and the controlled load transistors $Q_{31}$, $Q_{34}$, $Q_{35}$ and $Q_{38}$ act as load means, in that both sets of transistors are made conductive. For example, for the digit line $D_1$, transistors $Q_{31}$ and $Q_{32}$ are conductive and act as load means. Thus, effective conductance between the respective digit lines and the power voltage Vcc are made large. And hence, the digit line $\overline{D1}$, which has been in deep low level (indicated by a solid line), steeply rises to high level thereby to instantaneously set the digit lines D1 and $\overline{D1}$ to a balanced potential level. As a result, the memory device is in the read mode and then the digit line D1 assumes a low level, which is higher than the above deep low level as indicated by a dotted line in accordance with the data "1" in the memory cell $C_{1t}$. In this connection, the low level of the digit line in the read mode is drawn to the ground level by only the transistor of the memory cell, whose impedance is higher than that of the write circuit and accordingly it is higher than that in the write mode. As a result, a level change of the digit line when the write "0" is shifted to the read "1" is much larger than that when the read "0" (indicated by a dotted line of $\overline{D_1}$ in FIG. 10) is changed to the read "1". This has been the reason why the access time to the memory cell is delayed.

On the other hand, in the present invention, the signal level of the digit line, particularly the digit line which has been in a low level, is rapidly raised at the termination of the write mode to attain a balanced condition instantaneously. In this way, the memory device is instantaneously caused to be in a read-ready state. Accordingly, the present invention realizes a high speed access to the memory device. Additionally, in the memory device of the present invention, the current of load transistors ($Q_{32}$, $Q_{33}$, $Q_{36}$, $Q_{37}$), which are always conductive, is restricted to be small, thereby resulting in a great saving of power consumption.

Figure 11:
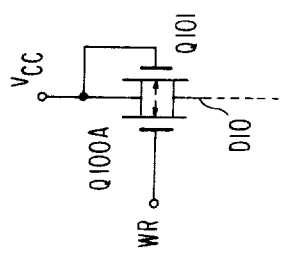
FIG. 11 is a circuit diagram of another embodiment of the invention.

In the present invention, the P-channel MISFET $Q_{31}$ to $Q_{38}$ of FIG. 3 may be substituted by N-channel MISFETs as shown in FIG. 11. In this case, the gate signal of N-channel MISFET Q100A has an opposite phase of the write. end signal shown in FIG. 3. The opposite phase signal is denoted as WR.

The present invention may be reduced to practice by using N-channel enhancement or depletion type MISFET.

As described above, the invention provides a useful static semiconductor memory device.

Having described specific embodiments of our bearing it is believed obvious that modification and variations of our invention are possible in light of the above teachings.

I claim:

1. A memory device comprising a plurality of word lines, a plurality of digit lines, a plurality of memory cells operably connected to said word lines and said digit lines, a plurality of load means arranged between said digit lines and a predetermined potential, said load means having controllable value of conductance, means for supplying a control signal having a first level designating a write operation for writing a first logical data in selected one of said memory cells and a second level for designating a read operation for reading out a logical data opposite to said first logical data from another selected one of said memory cells, detection means for detecting a transition in said control signal from said first level to said second level, said detection means generating an output signal of a third level over a predetermined period when said transition is detected, and means responsive to said output signal of said third level from said detection means for enhancing the conductance of said load means.

2. The memory device of claim 1, wherein said first logical data is a logical "0".

3. A memory device comprising a plurality of word lines; a plurality of digit line pairs; a plurality of memory cells, each of said memory cells comprising two pairs of field effect transistors, each pair serially connected between a first and a second potential source, each pair of said field effect transistors having their drains commonly connected, the gates of the first and second pair respectively connected to the drains of the second and the first pair of said field effect transistors, a pair of transfer gate field effect transistors, each respectively connected between the connecting point of the drains of each of said pairs of field effect transistors and a respective digit line, the gates of said pair of transfer gate field effect transistor connected to a respective word line; a plurality of first load field effect transistors arranged between a voltage supply means and the respective digit lines, a plurality of second load field effect transistors arranged between the voltage supply means and the respective digit lines; means for supplying a control signal having first and second levels to a control terminal; a write circuit for performing a write operation in response to said first level signal for a selected memory cell; a read circuit for performing a read operation for another selected memory cell in response to said second level signal; a change detection circuit for detecting a transition from said first level signal to said second level signal, said change detection circuit generating a detection signal over a predetermined period, said change detection circuit including a series circuit of a plurality of inverter circuits for transmitting said control signal from its input terminal to its output terminal and gate means for detecting a transit period when said control signal is transmitted from said input terminal of said series circuit to said output terminal of said series circuit, said detection signal being generated when said transit period is detected; means for rendering conductive said plurality of second load field effect transistors while said detection signal is present, and means for rendering conductive said plurality of first load field effect transistors irrespective of said detection signal.

4. The memory device according to claim 3, wherein the number of said inverter circuits is an odd number and said gate means includes a NOR circuit having a first input terminal connected to said input terminal of said series circuit and a second input terminal connected to said output terminal of said series circuit.

5. A memory device comprising a plurality of address lines, a plurality of digit lines, a plurality of static memory cells operably connected to said address lines and said digit lines, a plurality of address terminals for receiving a plurality of address signals, means for providing said address signals, a control terminal for receiving a control signal having a first level and a second level, means for providing said control signal, a mode select circuit producing a write enable signal in response to said first level signal and a read enable signal in response to said second level signal, a write circuit for providing selected digit line with a logic information to be written in response to said write enable signal, a control circuit for producing a write end signal when said control signal changes from said first level to said second level, a plurality of resistive elements arranged between said digit lines and a predetermined potential, and a plurality of field effect transistors arranged between said digit lines and said predetermined potential and in parallel with said resistive elements, the gates of said field effect transistors being supplied with said write end signal, in which effective resistance between said digit line and said predetermined potential is lowered in a transition period that the operation is shifted from a write operation to a read operation.

6. The memory device according to claim 5, wherein said control circuit includes a first inverter circuit for inverting said control signal, a second inverter circuit having an input supplied with and the inverted control signal from said first inverter circuit and a NOR gate having a first input terminal receiving an output of said first inverter circuit and a second input terminal receiving an output of said second inverter circuit.

7. The memory device according to claim 5, wherein the conducting resistance of said field effect transistor is smaller than the resistance of said resistive element.

8. The device of claim 5, said mode select circuit comprising first inverter means receiving an input from said control terminal, second inverter means receiving as an input the output of said first inverter means, third inverter means receiving as input the output of said first inverter means, wherein said write enable signal is provided by an output of said second inverter means, and said read enable signal is provided by an output of said third inverter means.

9. A static memory device in which a logic information to be written into a selected memory cell and a logic information readout from another selected memory cell are transferred through a digit line, comprising load means arranged between said digit lines and a predetermined potential and control means for making resistivity of said load means smaller in a transient period from a write cycle to a read cycle than it is in the write cycle and in the read cycle and in a transient period from a read cycle to a read cycle.

10. The memory device according to claim 9, further comprising detection means for detecting said transient period from a write cycle to a read cycle.

11. The memory device according to claim 9, further comprising means for supplying a control signal for selecting one of the write cycle and the read cycle.

12. A memory device comprising a plurality of word lines, a plurality of digit lines, a plurality of memory cells, a plurality of load means arranged between said digit lines and a predetermined potential, said load means having controllable value of conductance, means for supplying a control signal having a first level for designating a write operation for writing data in said memory cells and a second level for designating a read operation for reading data from said memory cells, detection means for detecting a change in said control signal from said first level to said second level, said detection means generating an output signal of a third level over a predetermined period when said change is detected, and control means responsive to said third level signal for enhancing the conductance of said load means.

13. The memory device according to claim, 12 or 10 wherein said detection means comprises a series circuit of inverter means having an input terminal supplied with said control signal, a NOR gate means receiving an input from an early stage of said series circuit and another input from a later stage of said series circuits, the output of said NOR gate means providing output of said detection means.

14. The memory device according to claims 12 or 1, further comprising read means resposive to said second level of said control signal for sensing a read-out information on a selected digit line.

15. The memory device according to claim, 12 or 9 wherein said load means comprises a first field effect transistor being made normally conductive and a second field effect transistor being made conductive in response to said third level signal from said detection means.

16. The memory device according to claim, 12 or 9 wherein said detection means comprises a plurality of inverter circuits connected in series for delaying said control signal and a gate circuit receiving said control signal and the delayed control signal.

17. The memory device according to claims 12, 5, or 1, further comprising write means responsive to said first level of said control signal for supplying a selected digit line with a logic information to be written.

18. The memory device according to claims 12, 9 or 1, wherein said load means includes a first field effect transistor being made conductive and a second field effect transistor controlled by said control means.

19. The memory device according to claims 12, 9, 5, 3 or 1, wherein each of said memory cell includes a pair of cross-coupled transistors and a transfer gate transistor arranged between one of cross-coupled points and associated one of said digit lines.

20. The circuit according to claims 15, 5, 3 or 1, wherein a conductance of said second field effect transistor is larger than that of said first field effect transistor.

21. The circuit according to claims 12, 9, 5, 3 or 1 wherein said memory cell comprises a flip-flop circuit.

* * * * *